United States Patent
Mokalla

(10) Patent No.: US 10,491,163 B1
(45) Date of Patent: Nov. 26, 2019

(54) FAST TURN-ON AMPLIFICATION SYSTEM

(71) Applicant: Qorvo US, Inc., Greensboro, NC (US)

(72) Inventor: Mehra Mokalla, Santa Clara, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/113,492

(22) Filed: Aug. 27, 2018

(51) Int. Cl.
  *H03F 3/72* (2006.01)
  *H03F 1/02* (2006.01)
  *H03F 3/60* (2006.01)
  *H03F 3/21* (2006.01)

(52) U.S. Cl.
  CPC ............ *H03F 1/0244* (2013.01); *H03F 3/21* (2013.01); *H03F 3/607* (2013.01); *H03F 2200/144* (2013.01); *H03F 2200/294* (2013.01)

(58) Field of Classification Search
  CPC ......... H03F 1/34; H03F 3/72; H03F 2200/144
  USPC .......................................... 330/51, 109, 294
  See application file for complete search history.

(56) References Cited

U.S. PATENT DOCUMENTS 3,248,655 A * 4/1966 Kobbe ................. G01R 13/342
                                                      327/118
3,341,696 A * 9/1967 Thaulow .............. G06G 7/1865
                                                      327/261
4,197,528 A * 4/1980 Gibson .............. G08B 13/1636
                                                      340/528

OTHER PUBLICATIONS

Benamor, I., et al., "Fast Turn On/Off Low Noise Amplifier for Duty Cycled Ultra-Wideband Impulse Radio," Proceedings of the 2014 IEEE International Conference on Ultra-WideBand (ICUWB), Sep. 1-3, 2014, Paris, France, pp. 331-336.

* cited by examiner

*Primary Examiner* — Steven J Mottola
(74) *Attorney, Agent, or Firm* — Withrow & Terranova, P.L.L.C.

(57) ABSTRACT

The present disclosure relates to an amplification system that includes an amplifier, a resistor-capacitor (RC) network, and a charging path circuit. Herein, the RC network is coupled between an input port and an output port of the amplifier and includes a feedback resistor and a feedback capacitor. The feedback resistor is coupled between the input port of the amplifier and a joint point in between the feedback resistor and the feedback capacitor, and the feedback capacitor is coupled between the joint point and the output port of the amplifier. The charging path circuit is coupled between the joint point and ground, and configured to accelerate a charging speed of the feedback capacitor and reduce turn-on time of the amplifier.

20 Claims, 2 Drawing Sheets

FAST TURN-ON AMPLIFICATION SYSTEM

FIELD OF THE DISCLOSURE

The present disclosure relates to an amplification system, and more particularly to a fast turn-on amplification system with a feedback network.

BACKGROUND

As high-frequency radio communication technology advances, there has been an increasing demand for high performance, compact size, and low cost amplifiers. It is a common practice to add a feedback network to the amplifier to improve its characteristics over process, supply voltage, and temperature (PVT).

Typically, the feedback network is coupled between a signal input and a signal output of the amplifier to form an amplification system. The feedback network is configured to enhance gain flatness, return loss, and out of band (low and high frequency) stability of the amplification system without disturbing the DC bias conditions on the input stage. However, a relatively large resistance and/or capacitance of the feedback network may significantly increase the turn-on time of the amplification system, which may not be acceptable in some applications. In addition, inductor usage in the amplification system may be limited, because it may be difficult to achieve a high-Q inductance in the band of interest, or cost/die size becomes a dominating factor in the amplification system.

Accordingly, there remains a need for improved amplification system designs, which reduce the turn-on time while performing correctly under process, supply voltage, and temperature variations. In addition, the amplification system designs will preferably be low cost and compact, and the circuitry of the amplification system will retain its simplicity.

SUMMARY

The present disclosure relates to a fast turn-on amplification system. The disclosed amplification system includes an input terminal, an output terminal, a bias terminal, a power terminal, an amplifier, a resistor-capacitor (RC) network, and a charging path circuit. Herein, the amplifier has an input port and an output port. The input port of the amplifier is coupled to the input terminal and the bias terminal, and configured to receive a combination of an input signal from the input terminal and a first bias voltage from the bias terminal. The output port of the amplifier is coupled to the output terminal and configured to provide an output signal. The output port of the amplifier is also coupled to the power terminal that provides a DC voltage supply to the amplifier. The RC network is coupled between the input port and the output port of the amplifier. The RC network includes a feedback resistor and a feedback capacitor coupled in series. The feedback resistor is coupled between the input port of the amplifier and a joint point of the feedback resistor and the feedback capacitor, while the feedback capacitor is coupled between the joint point and the output port of the amplifier. The charging path circuit is coupled between the joint point and ground, and configured to accelerate a charging speed of the feedback capacitor and reduce turn-on time of the amplifier.

In one embodiment of the amplification system, the charging path circuit includes a diode and a complementary metal-oxide-semiconductor (CMOS) transistor. The diode is coupled between the joint point and a drain of the CMOS transistor. A source of the CMOS transistor is coupled to ground, and a gate of the CMOS transistor is configured to receive a pulse signal. Herein, the pulse signal occurs when the first bias voltage is on and the DC voltage supply is stepped up, or when the DC voltage supply is on and the first bias voltage is stepped up.

In one embodiment of the amplification system, the pulse signal occurs when the first bias voltage is on and the DC voltage supply is stepped up, and the pulse signal and the DC voltage supply start at a same time.

In one embodiment of the amplification system, the pulse signal occurs when the DC voltage supply is on and the first bias voltage is stepped up, and the pulse signal and the first bias voltage supply start at a same time.

In one embodiment of the amplification system, the pulse signal has a duration between 1 ns and 100 ns.

In one embodiment of the amplification system, the charging path circuit includes a diode and a bipolar transistor. The diode is coupled between the joint point and a collector of the bipolar transistor. An emitter of the bipolar transistor is coupled to ground, and a base of the bipolar transistor is configured to receive a pulse signal.

In one embodiment of the amplification system, the amplifier is one of a low noise amplifier (LNA), a power amplifier (PA), a variable gain amplifier (VGA), and a distributed amplifier (DA).

In one embodiment of the amplification system, the amplifier includes at least one CMOS transistor. A drain of the at least one CMOS transistor is configured to receive the DC voltage supply and is coupled to the output port of the amplifier. A gate of the at least one CMOS transistor is coupled to the input port of the amplifier and is configured to receive the combination of the first bias voltage and the input signal. A source of the at least one CMOS transistor is coupled to ground.

In one embodiment of the amplification system, the amplifier further includes an inductor coupled between the source of the at least one CMOS transistor and ground.

In one embodiment of the amplification system, the amplifier includes a first CMOS transistor and a second CMOS transistor coupled in series. A drain of the first CMOS transistor is coupled to a source of the second CMOS transistor. A gate of the first CMOS transistor is coupled to the input port of the amplifier and configured to receive the combination of the first bias voltage and the input signal. A source of the first CMOS transistor is coupled to ground. A drain of the second CMOS transistor is configured to receive the DC voltage supply and is coupled to the output port of the amplifier. A gate of the second CMOS transistor is configured to receive a second bias voltage, which has a greater value than the first bias voltage.

In one embodiment of the amplification system, the amplifier includes at least one bipolar transistor. A collector of the at least one bipolar transistor is configured to receive the DC voltage supply and is coupled to the output port of the amplifier. A base of the at least one bipolar transistor is coupled to the input port of the amplifier and is configured to receive the combination of the first bias voltage and the input signal. An emitter of the at least one bipolar transistor is coupled to ground.

According to another embodiment, the amplification system further includes an input bias feed circuit. The input bias feed circuit is coupled between the bias terminal and the input port of the amplifier, and configured to pass the first bias voltage to the input port of the amplifier and prevent the input signal from going into the bias terminal. The input bias feed circuit includes a resistor.

According to another embodiment, the amplification system further includes a power feed circuit. The power feed circuit is coupled between the power terminal and the output port of the amplifier, and configured to isolate the DC voltage supply from the output signal. The power feed circuit includes an inductor.

According to another embodiment, the amplification system further includes an input capacitor coupled between the input terminal and the input port of the amplifier, and an output capacitor coupled between the output terminal and the output port of the amplifier.

According to another embodiment, the amplification system further includes a coupling capacitor coupled between the power terminal and ground.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
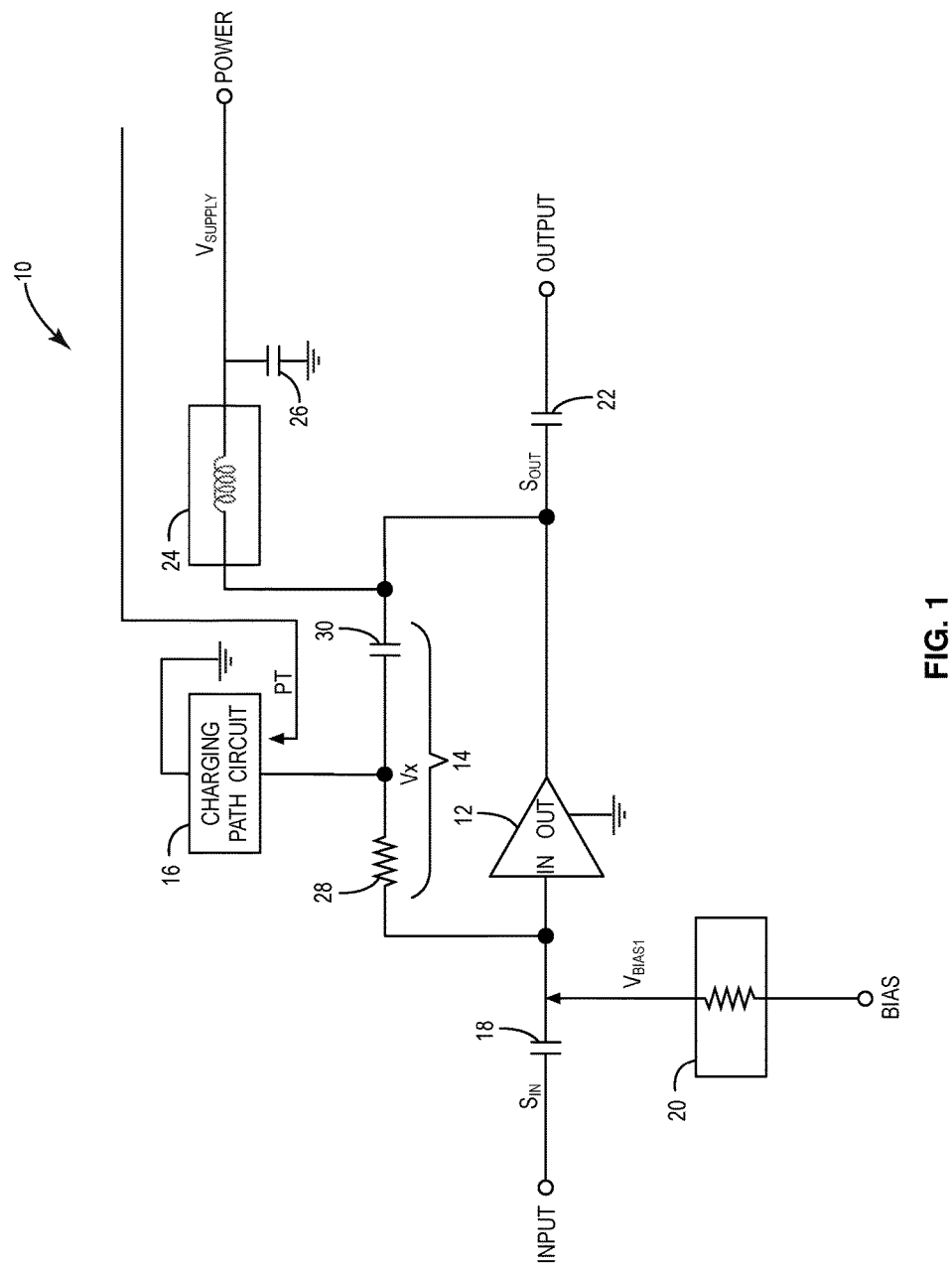
FIG. 1 shows an exemplary amplification system according to one embodiment of the present disclosure.
Figure 2A:
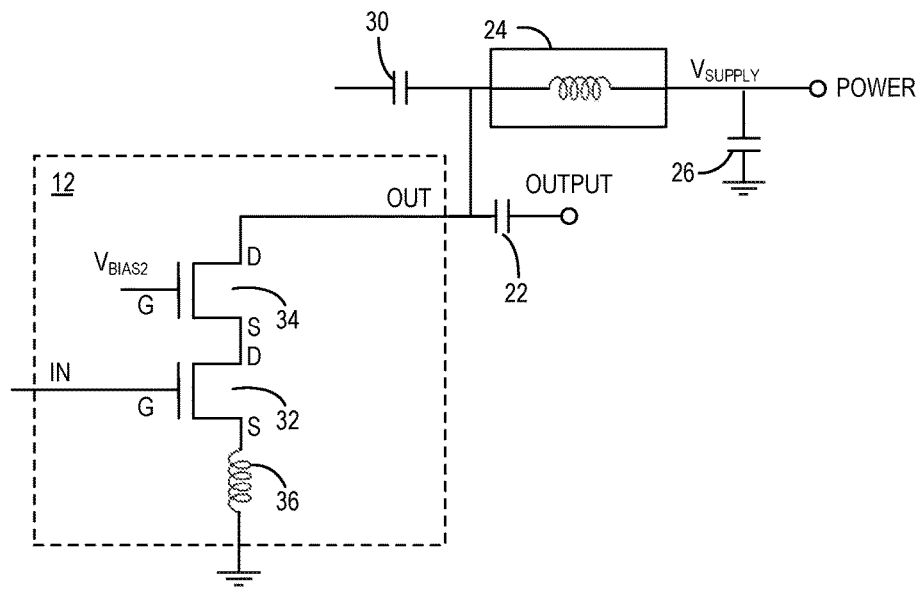
FIGS. 2A-2B show transistor level details of circuitry within the amplification system illustrated in FIG. 1.
Figure 2B:
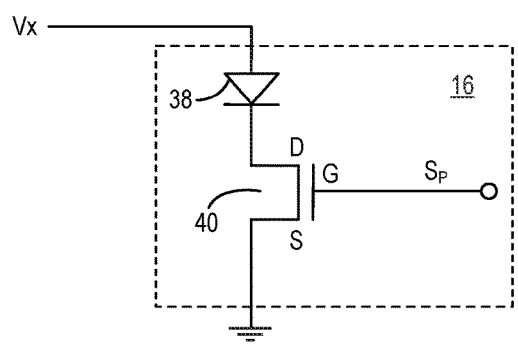

It will be understood that for clear illustrations, FIGS. 1-2B may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to a fast turn-on amplification system with a feedback network. FIG. 1 shows an exemplary amplification system 10 according to one embodiment of the present disclosure. The amplification system 10 includes an amplifier 12, a resistor-capacitor (RC) network 14, a charging path circuit 16, an input terminal INPUT, an output terminal OUTPUT, a bias terminal BIAS, and a power terminal POWER.

Herein, the amplifier 12 has an input port IN and an output port OUT. The input port IN of the amplifier 12 is coupled to both the input terminal INPUT and the bias terminal BIAS, and configured to receive a combination of an input signal $S_{IN}$ from the input terminal INPUT and a first bias voltage $V_{BIAS1}$ from the bias terminal BIAS. The output port OUT of the amplifier 12 is coupled to the output terminal OUTPUT and configured to provide an output signal $S_{OUT}$ to the output terminal OUTPUT. In addition, the output port OUT of the amplifier 12 is also coupled to the power terminal POWER that provides a DC voltage supply $V_{SUPPLY}$ to the amplifier 12. In different applications, the amplifier 12 may be a low noise amplifier (LNA), a power amplifier (PA), a variable gain amplifier (VGA), a distributed amplifier (DA), or other appropriate amplifiers.

In one embodiment, the amplification system 10 may include an input capacitor 18 and/or an input bias feed circuit 20 before the input port IN of the amplifier 12. The input capacitor 18 may be coupled between the input terminal INPUT and the input port IN of the amplifier 12, and configured to filter out DC components in the input signal $S_{IN}$. The input bias feed circuit 20 is coupled between the bias terminal BIAS and the input port IN of the amplifier 12. The input bias feed circuit 20 is configured to pass the first bias voltage $V_{BIAS1}$ to the input port IN of the amplifier 12 and prevent the input signal $S_{IN}$ from going into the bias terminal BIAS. As such, the input port IN of the amplifier 12 will receive a combination of the first bias voltage $V_{BIAS1}$ and a filtered input signal $S_{IN}$ that is isolated from the bias terminal BIAS at the operating frequency or frequencies of interest. An exemplary implementation of the input bias feed circuit 20 may be a resistor with a resistance between 1 ohm and 100000 ohms, and/or other electronic components (not shown). In this embodiment, an inductor may not be used in the input bias feed circuit 20 due to cost, size, bandwidth requirements, or other design constraints of the amplification system 10.

In addition, the amplification system 10 may also include an output capacitor 22 and/or a power feed circuit 24 after the output port OUT of the amplifier 12. The output capacitor 22 is coupled between the output port OUT of the amplifier 12 and the output terminal OUTPUT, and configured to filter out DC components in the output signal $S_{OUT}$ from the amplifier 12. The power feed circuit 24 is coupled between the power terminal POWER and the output port OUT of the amplifier 12, and configured to isolate the DC voltage supply $V_{SUPPLY}$ from the output signal $S_{OUT}$ at the operating frequency or frequencies of interest. An exemplary implementation of the power feed circuit 22 may be an inductor with an inductance between 1 nH and 1 mH, and/or other electronic components (not shown). Further, there may be a coupling capacitor 26 coupled between the power terminal POWER and ground, and configured to filter the DC voltage supply $V_{SUPPLY}$.

The RC network 14 is coupled between the input port IN of the amplifier 12 and the output port OUT of the amplifier 12. For the purpose of this illustration, the RC network 14 includes a feedback resistor 28 and a feedback capacitor 30 coupled in series. There is a joint point Vx between the feedback resistor 28 and the feedback capacitor 30. The feedback resistor 28 is coupled between the input port IN of the amplifier 12 and the joint point Vx. The feedback capacitor 30 is coupled between the joint point Vx and the output port OUT of the amplifier 12, and also between the joint point Vx and the power terminal POWER (may through the power feed circuit 24). The feedback resistor 28 may have a resistance between 100 ohm and 100000 ohm, and the feedback capacitor 30 may have a capacitance between 10 fF and 10 nF. In different applications, the RC network 14 may include more feedback resistors and/or more feedback capacitors with different configurations. Also, the feedback resistor 28 and the feedback capacitor 30 may have different values. In summary, the RC network 14 is configured to enhance out-of-band (low and high frequency) stability, gain flatness, and/or return loss of the amplifier 12.

The charging path circuit 16 is coupled between the joint point Vx and ground, so as to provide an electrical path PT from the power terminal POWER, through the feedback capacitor 30 and the charging path circuit 16, and to ground. Herein, the electrical path PT does not include the feedback resistor 28. When the charging path circuit 16 is enabled, the charging path circuit 16 has a small resistance and is configured to accelerate a charging speed of the feedback capacitor 30 (more details are described later).

In one embodiment, the amplifier 12 may be implemented by at least one transistor, as illustrated in FIG. 2A. For the purpose of this illustration, the amplifier 12 includes a first complementary metal-oxide-semiconductor (CMOS) transistor 32, a second CMOS transistor 34, and a first inductor 36. Herein, the first CMOS transistor 32, the second CMOS transistor 34, and the first inductor 36 are coupled in series. A drain of the first CMOS transistor 32 is coupled to a source of the second CMOS transistor 34. A gate of the first CMOS transistor 32 is coupled to the input port IN of the amplifier 12 and configured to receive the combination of the input signal $S_{IN}$ and the first bias voltage $V_{BIAS1}$ (not shown in FIG. 2A). A source of the first CMOS transistor 32 is coupled to ground via the first inductor 36. A drain of the second CMOS transistor 34 is configured to receive the DC voltage supply $V_{SUPPLY}$ and is coupled to the output port OUT of the amplifier 12. And a gate of the second CMOS transistor 34 is configured to receive a second bias voltage $V_{BIAS2}$, which has a greater value than the first bias voltage $V_{BIAS1}$. Notice that the gate of the second CMOS transistor 34 does not receive any AC input signal, and the second bias voltage $V_{BIAS2}$ received at the gate of the second CMOS transistor 34 is not provided from the bias terminal BIAS. The amplification system 10 may include another bias terminal (not shown) to provide the second bias voltage $V_{BIAS2}$ to the gate of the second CMOS transistor 34. Alternatively, the gate of the second CMOS transistor 34 is fixed at the second bias voltage $V_{BIAS2}$.

In different applications, the amplifier 12 may include fewer or more CMOS transistors. For instance, the second CMOS transistor 34 may be omitted. As such, the drain of the first CMOS transistor 32 is configured to receive the DC voltage supply $V_{SUPPLY}$ and is coupled to the output port OUT of the amplifier 12 (not shown). In addition, the first inductor 36 may be omitted (not shown), such that the source of the first CMOS transistor 32 is directly coupled to ground. Further, the amplifier 12 may be implemented by one or more bipolar transistors instead of CMOS transistors (not shown). As such, a collector of the at least one bipolar transistor is configured to receive the DC voltage supply $V_{SUPPLY}$ and is coupled to the output port OUT of the amplifier 12. A base of the at least one bipolar transistor is coupled to the input port IN of the amplifier 12 and configured to receive the combination of the input signal $S_{IN}$ and the first bias voltage $V_{BIAS1}$. And an emitter of the at least one bipolar transistor is coupled to ground (not shown).

One exemplary implementation of the charging path circuit 16 is illustrated in FIG. 2B. The charging path circuit 16 includes a diode 38 and a third CMOS transistor 40. The diode 38 is coupled between the joint point Vx and a drain of the third CMOS transistor 40. A source of the third CMOS transistor 40 is coupled to ground, and a gate of the third CMOS transistor 40 is configured to receive a pulse signal $S_P$. Herein, the pulse signal $S_P$ only occurs when the amplifier 12 is in initial turn-on conditions. The initial turn on conditions of the amplifier 12 may include initially having the first bias voltage $V_{BIAS1}$ on and then stepping up the DC voltage supply $V_{SUPPLY}$, or initially having the DC voltage supply $V_{SUPPLY}$ on and then stepping up the first bias voltage $V_{BIAS1}$. If the first bias voltage $V_{BIAS1}$ is on first and then the DC voltage supply $V_{SUPPLY}$ is stepped up, the pulse signal $S_P$ and the DC voltage supply $V_{SUPPLY}$ may start at a same time. If the DC voltage supply $V_{SUPPLY}$ is on first and then the first bias voltage $V_{BIAS1}$ is stepped up, the pulse signal $S_P$ and the first bias voltage $V_{BIAS1}$ may start at a same time. The pulse signal $S_P$ is high and long enough to conduct the third CMOS transistor 40, and a duration of the pulse signal $S_P$ may be between 1 ns and 100 ns.

It is clear to those skilled in the art that when the diode 38 and the third CMOS transistor 40 are conducted, the resistance of the charging path circuit 16 is relatively low (may be between 1 ohm and 10 ohm). Therefore, the time constant of the electrical path PT (from the power terminal POWER, through the feedback capacitor 30 and the charging path circuit 16, and to ground) is relatively small, and the charging speed of the feedback capacitor 30 is relatively fast. Once the feedback capacitor 30 stores enough electric charge, the first CMOS transistor 32 in the amplifier 12 will reach a stable steady-state and will be in an operating-on condition. The charging path circuit 16 is configured to quickly force a voltage at the joint point Vx to a steady-state condition voltage that is about the first bias voltage $V_{BIAS1}$.

If there is no charging path circuit 16 in the amplification system 10, when the amplifier 12 is in the initial turn-on conditions, there may be two electrical paths for current flow that will charge the feedback capacitor 30. A first electrical path is from the power terminal POWER to the gate of the first CMOS transistor 32, through the feedback capacitor 30 and the feedback resistor 28. A second electrical path is from the power terminal POWER to the bias terminal BIAS, through the feedback capacitor 30, the feedback resistor 28, and the input bias feed circuit 20. Both of the first and second electrical paths, which charge the feedback capacitor 30 during the initial turn-on conditions of the amplifier 12, have the feedback resistor 28 that limits the charging speed of the feedback capacitor 30. At the beginning of the initial turn-on conditions of the amplifier 12, the feedback capacitor 30 is not charged and the voltage across the feedback capacitor 30 is zero. Therefore, the voltage at the joint point Vx will start from undesirably high voltage about the DC voltage supply $V_{SUPPLY}$. Since the joint point Vx is coupled to the input port IN of the amplifier 12 (the gate of the first CMOS transistor 32) through the feedback resistor 28, an excessive overshoot bias condition may occur at the input port IN of the amplifier 12 (the gate of the first CMOS transistor 32) until the feedback capacitor 30 is charged (the voltage at the joint point Vx reaches a steady-state operation value that is about the first bias voltage $V_{BIAS1}$). The overshoot bias condition may lead to drooping of the DC voltage supply $V_{SUPPLY}$ or thermal increasing of the amplifier 12 that may further delay the amplifier system 10 to reach a steady-state condition.

In contrast, when the charging path circuit 16 provides a low resistance path to ground for the feedback capacitor 30 during the initial turn-on conditions, the feedback capacitor 30 may be quickly charged, and the joint point Vx may be quickly forced at the steady-state voltage about the first bias voltage $V_{BIAS1}$. The charging speed of the feedback capacitor 30 will not be limited by the electrical paths going through the feedback resistor 28. Since the resistance of the charging path circuit 16 may be made 100 to 10000 times less than the feedback resistor 28, the feedback capacitor 30 may be charged 100 to 10000 times faster. In addition, since the charging path circuit 16 sets a predetermined steady-state voltage about the first bias voltage $V_{BIAS1}$ on the joint point Vx, the feedback capacitor 30 will not be over charged. Consequently, both sides of the feedback resistor 28 will be at the same voltage, current flow in the feedback resistor 28 will stop, and a steady-state condition will be achieved. It is clear that the charging path circuit 16 will accelerate the charging speed of the feedback capacitor 30 to a steady-state condition regardless of the implementation of the input bias feed circuit 20. Even if the input bias feed circuit 20 includes large resistance components, the charging speed of the feedback capacitor 30 will not be affected. Further, the turn-on time of the amplifier 12 will be short and will not be limited by the feedback network 14. The turn-on time of the amplifier 12 may only be limited by the time constant of the effective resistance of the input bias feed circuit 20 and the gate to source capacitance of the transistor 32.

In another embodiment, the diode 38 may be omitted in the charging path circuit 16 (not shown), such that the drain of the third CMOS transistor 40 is directly coupled to the joint point Vx. Further, the third CMOS transistor 40 may be replaced by a bipolar transistor (not shown), such that the diode 38 is coupled between the joint point Vx and a collector of the replaced bipolar transistor. An emitter of the replaced bipolar transistor is coupled to ground, and a base of the replaced bipolar transistor is configured to receive the pulse signal $S_P$. No matter what electronic components are included in the charging path circuit 16 or how these electronic components are configured, the charging path circuit 16 is configured to provide a low time constant charging path for the feedback capacitor 30 and accelerate the turn-on speed of the amplifier 12.

Those skilled in the art will recognize improvements and modifications to the preferred embodiments of the present disclosure. All such improvements and modifications are considered within the scope of the concepts disclosed herein and the claims that follow.

What is claimed is:

1. An amplification system comprising:
   an input terminal, an output terminal, a bias terminal and a power terminal;
   an amplifier with an input port and an output port, wherein:
   the input port of the amplifier is coupled to the input terminal and the bias terminal, and configured to receive a combination of an input signal from the input terminal and a first bias voltage from the bias terminal;
   the output port of the amplifier is coupled to the output terminal and configured to provide an output signal; and
   the output port of the amplifier is coupled to the power terminal that provides a DC voltage supply to the amplifier;
   a resistor-capacitor (RC) network coupled between the input port and the output port of the amplifier, wherein:
   the RC network comprises a feedback resistor and a feedback capacitor coupled in series;
   the feedback resistor is coupled between the input port of the amplifier and a joint point of the feedback resistor and the feedback capacitor, but not coupled between the input port of the amplifier and the input terminal; and
   the feedback capacitor is coupled between the joint point and the output port of the amplifier; and
   a charging path circuit coupled between the joint point and ground, wherein the charging path circuit is configured to accelerate a charging speed of the feedback capacitor, so as to reduce turn-on time of the amplifier.

2. The amplification system of claim 1 wherein the charging path circuit comprises a diode and a complementary metal-oxide-semiconductor (CMOS) transistor, wherein:

the diode is coupled between the joint point and a drain of the CMOS transistor;
a source of the CMOS transistor is coupled to ground; and
a gate of the CMOS transistor is configured to receive a pulse signal.

3. The amplification system of claim 2 wherein the pulse signal occurs when the first bias voltage is on and the DC voltage supply is stepped up, or when the DC voltage supply is on and the first bias voltage is stepped up.

4. The amplification system of claim 3 wherein:
the pulse signal occurs when the first bias voltage is on and the DC voltage supply is stepped up; and
the pulse signal and the DC voltage supply start at a same time.

5. The amplification system of claim 3 wherein:
the pulse signal occurs when the DC voltage supply is on and the first bias voltage is stepped up; and
the pulse signal and the first bias voltage supply start at a same time.

6. The amplification system of claim 3 wherein the pulse signal has a duration between 1 ns and 100 ns.

7. The amplification system of claim 1 wherein the charging path circuit comprises a diode and a bipolar transistor, wherein:
the diode is coupled between the joint point and a collector of the bipolar transistor;
an emitter of the bipolar transistor is coupled to ground; and
a base of the bipolar transistor is configured to receive a pulse signal.

8. The amplification system of claim 1 wherein the amplifier is one of a group consisting of a low noise amplifier (LNA), a power amplifier (PA), a variable gain amplifier (VGA) and a distributed amplifier (DA).

9. The amplification system of claim 1 wherein the amplifier comprises at least one complementary metal-oxide-semiconductor (CMOS) transistor, wherein:
a drain of the at least one CMOS transistor is configured to receive the DC voltage supply and is coupled to the output port of the amplifier;
a gate of the at least one CMOS transistor is coupled to the input port of the amplifier and is configured to receive the combination of the first bias voltage and the input signal; and
a source of the at least one CMOS transistor is coupled to ground.

10. The amplification system of claim 9 wherein the amplifier further comprises an inductor coupled between the source of the at least one CMOS transistor and ground.

11. The amplification system of claim 1 wherein the amplifier comprises a first complementary metal-oxide-semiconductor (CMOS) transistor and a second CMOS transistor coupled in series, wherein:
a drain of the first CMOS transistor is coupled to a source of the second CMOS transistor;
a gate of the first CMOS transistor is coupled to the input port of the amplifier and configured to receive the combination of the first bias voltage and the input signal;
a source of the first CMOS transistor is coupled to ground;
a drain of the second CMOS transistor is configured to receive the DC voltage supply and is coupled to the output port of the amplifier; and
a gate of the second CMOS transistor is configured to receive a second bias voltage, which has a greater value than the first bias voltage.

12. The amplification system of claim 1 wherein the amplifier comprises at least one bipolar transistor, wherein:
a collector of the at least one bipolar transistor is configured to receive the DC voltage supply and is coupled to the output port of the amplifier;
a base of the at least one bipolar transistor is coupled to the input port of the amplifier and is configured to receive the combination of the first bias voltage and the input signal; and
an emitter of the at least one bipolar transistor is coupled to ground.

13. The amplification system of claim 1 further comprising an input bias feed circuit, wherein the input bias feed circuit is coupled between the bias terminal and the input port of the amplifier, and configured to pass the first bias voltage to the input port of the amplifier and prevent the input signal from going into the bias terminal.

14. The amplification system of claim 13 wherein the input bias feed circuit comprises a resistor.

15. The amplification system of claim 1 further comprising a power feed circuit, wherein the power feed circuit is coupled between the power terminal and the output port of the amplifier, and is configured to isolate the DC voltage supply from the output signal.

16. The amplification system of claim 15 wherein the power feed circuit comprises an inductor.

17. The amplification system of claim 1 further comprising an input capacitor coupled between the input terminal and the input port of the amplifier.

18. The amplification system of claim 1 further comprising an output capacitor coupled between the output terminal and the output port of the amplifier.

19. The amplification system of claim 1 further comprising a coupling capacitor coupled between the power terminal and ground.

20. The amplification system of claim 1 wherein the charging path circuit does not include a resistor.

* * * * *